(12) United States Patent
Lin

(10) Patent No.: US 6,175,238 B1
(45) Date of Patent: Jan. 16, 2001

(54) BINARY ELECTROSTATIC DISCHARGE LOCATOR

(75) Inventor: Don L. Lin, Neshanic Station, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/271,085

(22) Filed: Mar. 17, 1999

(51) Int. Cl.[7] .......................... G01N 27/60; G01R 29/12
(52) U.S. Cl. ............................................ 324/452; 324/457
(58) Field of Search .................................. 324/452, 457, 324/72.5

(56) References Cited

U.S. PATENT DOCUMENTS

| | | | |
|---|---|---|---|
| 4,631,473 | * 12/1986 | Honda | 324/72.5 |
| 4,975,686 | * 12/1990 | Delcourt | 324/457 |
| 5,923,160 | * 7/1999 | DeChiaro et al. | 324/457 |

* cited by examiner

*Primary Examiner*—Safet Metjahic
*Assistant Examiner*—James C Kerveros
(74) *Attorney, Agent, or Firm*—Woodbridge & Associates, P.C.; Richard C. Woodbridge

(57) ABSTRACT

This invention relates to a system and method for economically locating an ESD event with a reasonable degree of accuracy. It performs this function using a binary approach in which one or more binary ESD locator boxes are used. Each of these binary ESD locator boxes incorporates two antennas and performs the function of determining which of these antennas receives the ESD signal first. This determination establishes the ESD event as occurring to one side of a planar surface. By incorporating one or more additional binary ESD locator boxes, the system can determine whether an ESD event occurred within a two dimensional area or within a three dimensional area.

11 Claims, 3 Drawing Sheets

BINARY ELECTROSTATIC DISCHARGE LOCATOR

BACKGROUND OF THE INVENTION

1. Field of the Invention

This invention relates to an apparatus for determining the location of an electrostatic discharge event (ESD).

2. Description of Related Art

Some electrostatic discharge events (ESD) are of such a low level as to be virtually imperceptible to human beings, even though these discharges may cause significant damage, such as to electronic devices. Detectors have been invented which are capable of detecting the occurrence of such an ESD event but which are incapable of determining its location. An example of such a system is disclosed in U.S. Pat. No. 4,631,473 issued to Masamitsu Honda on Dec. 23, 1986 and entitled "Transient Electromagnetic Field Detector".

A device which is capable of actually pin-pointing the location of an ESD event has been achieved in U.S. Pat. No. 5,923,150, issued to DeChiaro et al., entitled "Electrostatic Discharge Event Locators" (the EELS system) which was filed Apr. 19, 1997 and issued Jul. 13, 1999 and which is hereby incorporated in total by reference. This EELS system achieves great precision in determining the ESD location within a cube of 5 mm in dimension. This precision is attained at the expense of elaborate electronic circuitry, including expensive high speed analog-digital converters that need a high speed clock to drive the system.

There are many applications where the need for the precision of locating the ESD event lies between the above two approaches. That is, more that just a determination that an ESD event occurred is needed yet the 5 mm precision and corresponding cost of the EELS system is not warranted. For example, one may like to know if there are ESD events that are originating from a volume of space, for example, 2 m×2 m×10 m in dimension, where sensitive electronic circuit boards are being assembled. Another example would be a 2 m×2 m×6 m area in which sensitive equipment was being operated. Still another example would relate to protection of life and property by determining if there were ESD sparks occurring in an area where flammables or explosives are present.

In addition to the above determinations as to a volume of space, there may exist situations in which it is only necessary to evaluate an open ended area, for example, 2 m×4 m in dimension, regardless of the vertical location of the events. Still even simpler would be an application in which it is only necessary to determine if a given ESD event comes from the right or left sides of a planar surface.

For each of these cases, the 5 mm precision of a locating system such as the EELS system is not necessary, and in light of its associated costs, is not desired. The present invention addresses these cases in achieving sufficient accuracy in determining the location of the ESD event at a significantly reduced cost.

SUMMARY OF THE INVENTION

The present invention uses a binary approach to locate ESD events without the need of a high speed clock and associated high speed A/D converters. A basic unit of this system is a binary ESD locator box which determines if a given ESD event comes from the right or left sides of a planar surface. This binary ESD locator box incorporates two antennas and performs the function of determining which of these antennas receives the ESD signal first. As depicted in FIG. 1, this determination identifies whether the ESD event occurred to the left or to the right of the line aa'. By incorporating one or more additional pair of antennas, the system can determine whether an ESD event occurred within a two dimensional area or within a three dimensional area.

These and other features of the invention will be more fully understood by reference to the following drawings.

DETAILED DESCRIPTION OF THE INVENTION

During the course of this description, like numbers will be used to identify like elements according to different figures which illustrate the invention.

The present invention is used to economically locate an ESD event with a reasonable degree of accuracy. It performs this function using a binary approach method. In the preferred embodiment, this is achieved by using one or more binary ESD locator boxes.

Figure 1:
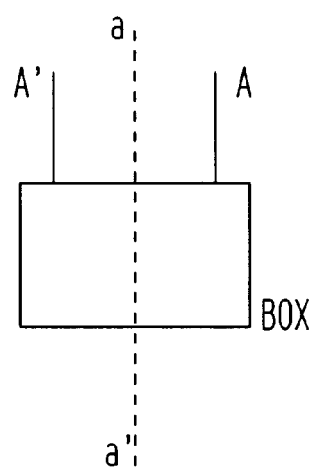
FIG. 1 is a schematic diagram of the Binary ESD locator box of the present invention.

As depicted in FIG. 1, each binary ESD locator box contains two antennas. The function of the binary ESD locator box is to determine which of these antennas receives the ESD signal first. If antenna A receives the signal first, the ESD event must have originated at a location to the right of line aa'. If antenna A' receives it first, the event originated on the left hand side of line aa'. In the preferred embodiment, one of two light emitting diodes (LEDs) can be lit to thereby signify which side received the signal first.

For the sake of convenience in explanation of the principal of the invention, FIG. 1 and the accompanying description above relate to a single planar surface. In fact, the determination that the ESD event originated to the left or right side addresses points of origin that lie above or below the plane of the box illustrated in FIG. 1. That is, the system determines a demarcation plane which is perpendicular to the plane of the box and wherein the line aa' is the line of intersection of these two planes.

Figure 2A:
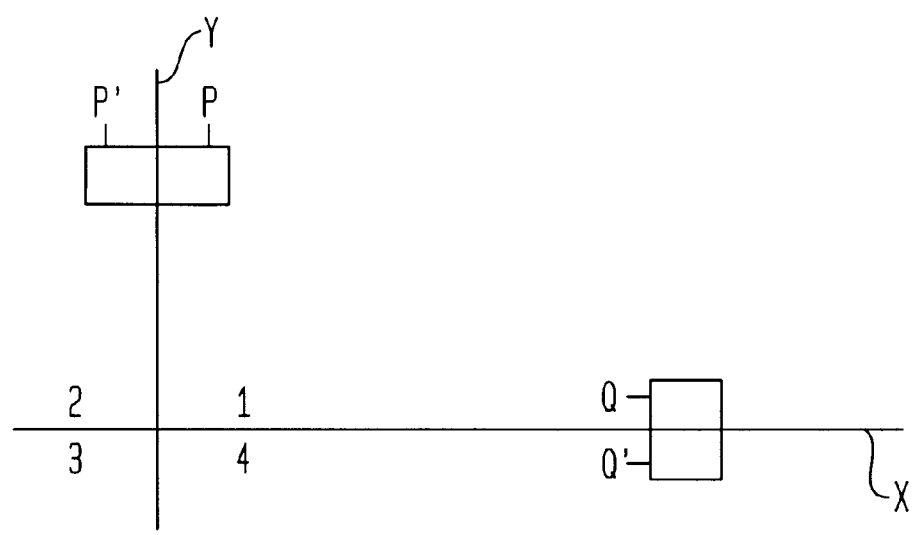
FIGS. 2A and 2B are schematics of two Binary ESD locators used to define the search space into four areas.

One binary ESD locator box thereby divides a space that is being monitored into two sides. By using two binary ESD locator boxes, as deployed as in FIG. 2A, the space can be divided into four areas. One ESD event will then result in two of the four LEDs being lit. Table 1 shows the quadrant where an ESD event occurs as a function of which two LEDs are lit.

TABLE 1

| LEDs light on | Quadrant |
|---|---|
| P and Q | 1 |
| P' and Q | 2 |
| P' and Q' | 3 |
| P and Q' | 4 |

Figure 2B:
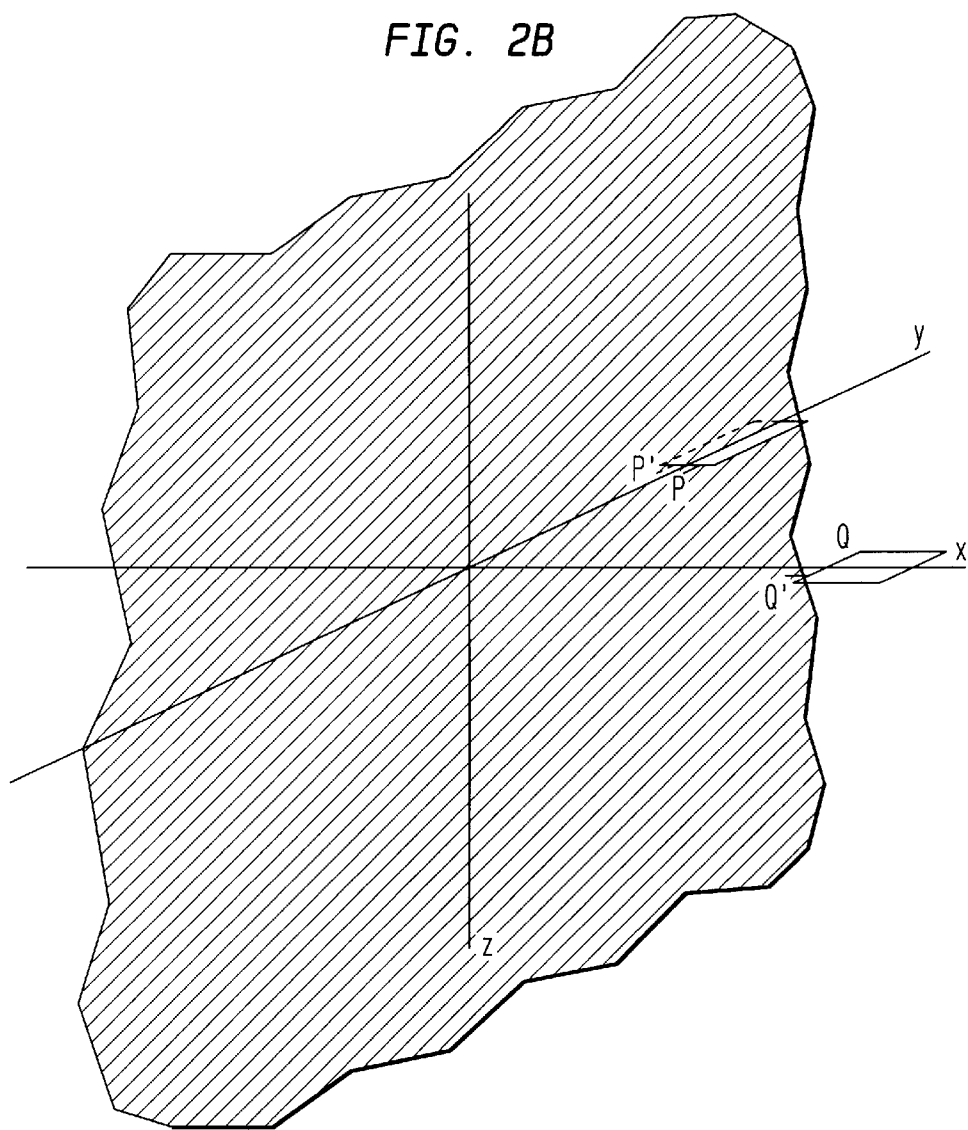

As in the case of the ESD locator box, the lines x and y represent lines of intersections of planes. FIG. 2B depicts a three dimensional illustration of one of these planes using a z-axis perpendicular to the x-y plane.

Figure 3:
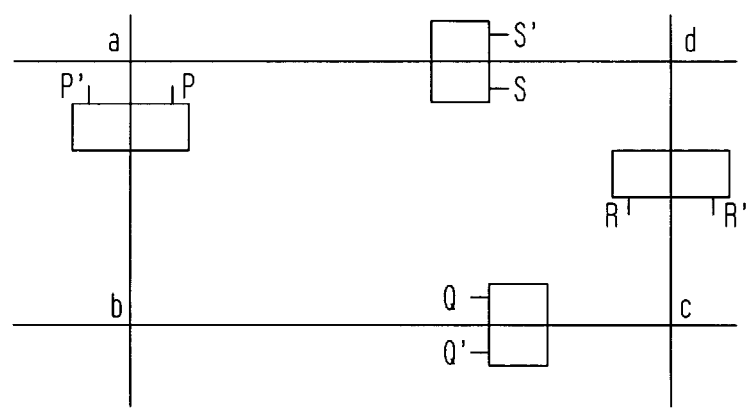
FIG. 3 is a schematic of four Binary ESD locators used to detect ESD events within an open ended, box-shaped area.

As each binary ESD locator boxes determines a demarcation plane, four boxes deployed as depicted in FIG. 3, would resulting in a system capable of detecting whether an ESD event has originated within a rectangular box, open at each end, and having a cross sectional area as depicted by the rectangle abcd. Consequently, should an ESD event occur within this monitored area, the system would light the LEDs associated with antennas P, Q, R and S.

Figure 4:
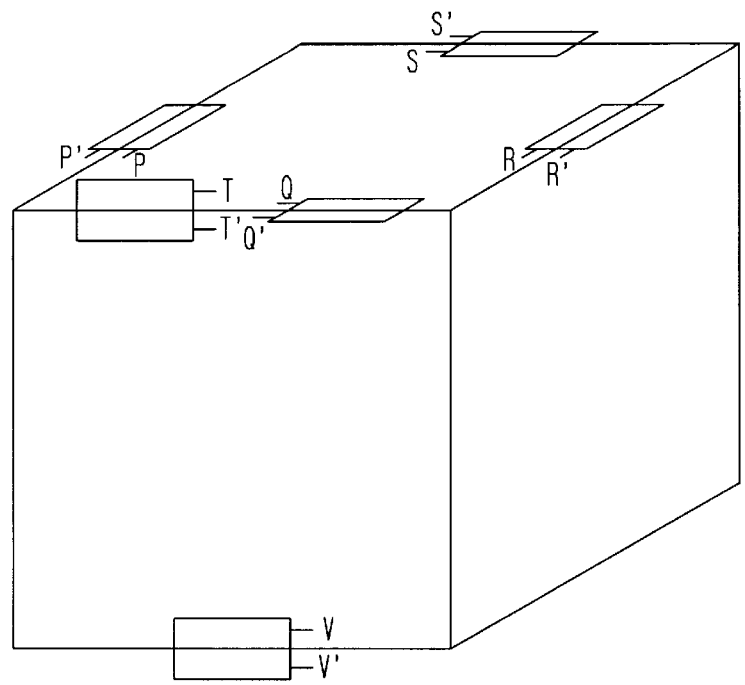
FIG. 4 is a diagram illustrating six binary ESD locators used to detect ESD events within a closed, box-shaped area.

In a similar manner, six ESD locator boxes (one for each surface) could be employed to monitor a closed, box shaped area as depicted in FIG. 4. In FIG. 4, antennas P, Q, R and S determine a cross sectional rectangle as described above with reference to FIG. 3. Antennas T and V determine planes which define the top and bottom surfaces respectively of the cube-shaped figure.

Figure 5:
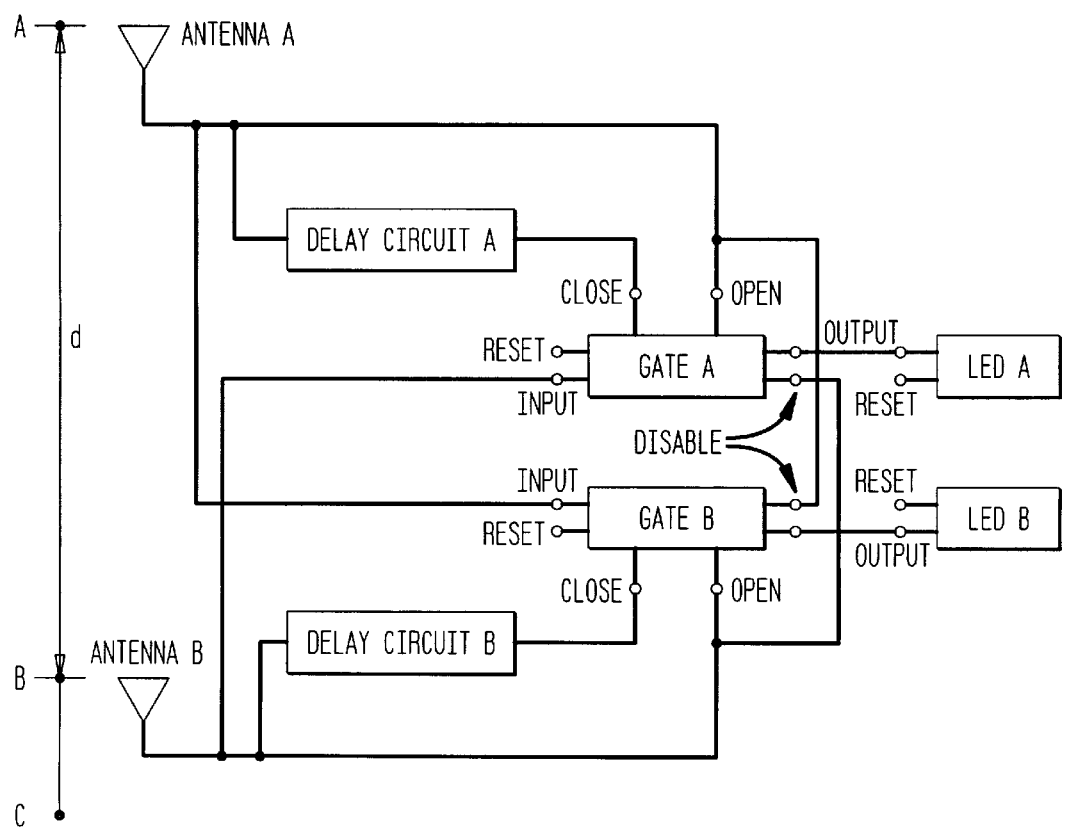
FIG. 5 is a hardware block diagram of the logic circuit for the binary ESD locator box of the preferred embodiment of the present invention.

FIG. 5 depicts the circuitry of the binary ESD locator box of the preferred embodiment of the present invention. The antennas are whip antennas of approximately 5 cm in length. Delay circuits A and B are implemented using a transmission line of proper length. It is well known that the delay time per unit length is given by the expression $(LC)^{1/2}$ where L and C are the inductance and capacitance per unit length of the transmission line. In the preferred embodiment of the present invention, RG 58/U cable was used having L=212 nH/m and C=85 pF/m which yield a time delay per unit length of 4.2 ns/m. Consequently, a 0.24 m cable of this material would provide a 1 ns delay.

The theory and operation of this circuit will now be described. As depicted in FIG. 5, let d be the distance between antennas A and B. If the ESD source is on the bisector plane of the line AB, the difference in arrival time is zero because the signal arrives at A and B at the same time. If the ESD source is co-linear with points A and B, but not on the line segment AB (e.g., point C), the difference in arrival time is the greatest, and is given by $\Delta T=d/c$, where c is the speed of light in air. In the preferred embodiment, the system is constructed with d=1 ft. and consequently, $\Delta T=1$ ns. Since this 1 foot distance represent the maximum difference in arrival time, the difference in arrival time for any ESD source anywhere in the space being monitored is going to be between 0 and 1 ns. For such a system, the delay circuit in FIG. 5 is designed to delay the signal by 1 ns.

In the following discussion of the operation of the system, suppose radiation from an ESD event arrives at antenna A first. As depicted in FIG. 5, signal A is split four ways. The first goes to open gate A, the second to disable gate B, the third to a delay circuit A, and the fourth to the input of gate B. Because signal A arrives earlier than signal B, gate A is opened and gate B is disabled. Gate A will remain open for 1 ns, long enough to accommodate the arrival of signal B, as determined by the above analysis. Signal B will pass through gate A and turn on LED A. As gate B is disabled, signal B cannot open it and no signal can go through gate B to turn on LED B. Consequently, LED A is lit and LED B is off.

To prepare for the next ESD event, a reset function is employed, as shown in FIG. 5. In the preferred embodiment of the invention, the system is manually operated whereby the reset action can be achieved by a reset button connected to the RESET terminals of both the two gates and the two LEDs. In an alternative embodiment, a signal derived automatically from the CLOSE terminal of the activated gate, such as gate A in this example, can be used to perform this reset function.

In another alternative embodiment of the present invention, a computer is connected to the operation of the binary ESD locators for the automatic recording of occurrence time of ESD events. LEDs may optionally be included in such a system for a visible display. Data automatically collected by the computerized system could be analyzed to remediate possible causes of the ESD events. An additional embodiment would have the system sound some type of alarm signal should the occurrences of ESD events exceed some threshold. Such a computer-controlled operation would be useful for the unattended monitoring of ESD events in those places where ESD events are a threat to product quality or services using ESD-sensitive equipment or, more importantly, are a threat to safety.

In another alternative embodiment, each ESD locator box may include some signal processing to eliminate situations where signals received at their antennas are not ESD events. This type of signal processing is well known in the ESD event detection art and may include, for example, a comparison of the signal against a simple threshold, as disclosed in the above referenced, co-pending U.S. patent application Ser. No. 08/545,122 entitled "Electrostatic Discharge Event Locators". Alternatively, this processing could be performed by the system once, independently of the binary ESD locator boxes. That is, the boxes can be used to detect where an antenna-detected event has occurred. The system would then simply ignore such an event if it was not characterized as an ESD event.

While the invention has been described with reference to the above alternative embodiments thereof, it will be appreciated by those of ordinary skill in the art that various modifications can be made to the structure and function of the individual parts of the system without departing from the sprit and scope of the invention as a whole. An example of such a modification would be deploying only three ESD locators to define a triangular area to be monitored (rather than the rectangular area described above).

I claim:

1. A binary search method for determining the origin of a signal capable of being detected by an antenna, said method comprising the steps of:

(a) deploying at least one binary locator box having an antenna A and an Antenna B; and, (b) determining, for each binary locator box, whether antenna A or antenna B was the first to receive the detected signal, thereby determining whether said origin is to the left or right of a demarcation plane between antenna A and antenna B.

2. A binary search method for monitoring a physical area and determining whether a signal capable of being detected by an antenna originated within that area, said method comprising the steps of:

(a) deploying at least one binary locator box having an antenna A and an Antenna B, such that each demarcation plane between each antenna A and antenna B is located on a boundary of said physical area; and, (b) determining, for each binary locator box, whether antenna A or antenna B was the first to receive the detected signal, thereby determining whether the signal originates within the physical area.

3. The method of claim 2 wherein the deploying step further comprises the step of:
   (c) using each binary locator box to define a demarcation plane.

4. The method of claim 3 wherein said deploying step further comprises the step of:
   (d) locating said one or more of said binary locator boxes such that the resulting demarcation planes define the area to be monitored.

5. A system for determining the location of an ESD event including at least one binary ESD locator box comprising the following:
   (a) An antenna A and an antenna B, wherein the signal received by antenna A is electrically split into four paths AP1, AP2, AP3, and AP4, and the signal received by antenna B is electrically split into four paths BP1, BP2, BP3, and BP4;
   (b) a gate A and a gate B, each having open, close, input, disable, reset, and output terminals, wherein path AP1 is connected to the open terminal of gate A, path AP2 is connected to the disable terminal of gate B and path AP3 is connected to the input terminal of gate B, and wherein path BP1 is connected to the open terminal of gate B, path BP2 is connected to the disable terminal of gate A, and path BP3 is connected to the input terminal of gate A;
   (c) delay means A with input connected to path AP4 and output connected to the close terminal of gate A, for delaying the signal received by antenna A; and,
   (d) delay means B with input connected to path BP4 and output connected to the close terminal of gate B, for delaying the signal received by antenna B,
   so that the signal is received at the output terminal of gate A when the signal is nearer to antenna A and the signal is received at the output terminal of gate B when the signal is nearer to antenna B.

6. The system of claim 5 further comprising an LED A connected to the output of gate A and an LED B connected to the output terminal of gate B, and wherein only one of said LEDs is lit at a time to indicate which antenna first received said electromagnetic signal.

7. The system of claim 6 wherein said delay means A and said delay means B each comprise a transmission line of predetermined length.

8. The system of claim 7 further comprising:
   (f) a resetting means for resetting both gate A and gate B and both LED A and LED B.

9. The system of claim 8 further comprising:
   (g) an automatic reset means whereby a signal derived from the close terminal of the activated gate triggers said resetting means.

10. The system of claim 5 further comprising a computer means for recording the signals received at the output terminal of gate A and the output terminal of gate B.

11. A system for determining the location of an ESD event comprising:
    (a) at least one binary ESD locator box attached to an antenna A and an antenna B;
    (b) a pair of electronic gating means A and B connected to each antenna A and antenna B such that a signal arriving first at antenna A closes gating means B and a signal arriving first at antenna B closes gating means A, thereby indicating whether a signal was first received at antenna A or at antenna B; and,
    (c) delaying means for closing said electronic gating means after a selected delay period.

* * * * *